US012751228B2

(12) United States Patent
Jung et al.

(10) Patent No.: US 12,751,228 B2
(45) Date of Patent: Sep. 29, 2026

(54) TRANSDUCERS INCLUDING LASER ETCHED SUBSTRATES

(71) Applicant: Baker Hughes Oilfield Operations LLC, Houston, TX (US)

(72) Inventors: Sebastian Jung, Isernhagen (DE); Thomas Kruspe, Wietzendorf (DE); Andreas Herbel, Hannover (DE)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 130 days.

(21) Appl. No.: 18/600,206

(22) Filed: Mar. 8, 2024

(65) Prior Publication Data

US 2024/0247582 A1 Jul. 25, 2024

Related U.S. Application Data

(62) Division of application No. 16/421,967, filed on May 24, 2019, now abandoned.

(Continued)

(51) Int. Cl.

*H10P 50/64* (2026.01)
*E21B 47/01* (2012.01)

(Continued)

(52) U.S. Cl.

CPC ............ *H10P 50/642* (2026.01); *E21B 47/01* (2013.01); *E21B 47/017* (2020.05); *G01B 11/18* (2013.01); *G01D 5/353* (2013.01); *G01P 15/093* (2013.01)

(58) Field of Classification Search

CPC ...... E21B 47/01; E21B 47/017; E21B 47/135; G01B 11/18; G01B 11/165; G01D 5/353;

(Continued)

(56) References Cited

U.S. PATENT DOCUMENTS 3,328,653 A 6/1967 Wolf, Jr.
4,079,508 A 3/1978 Nunn (Continued)

FOREIGN PATENT DOCUMENTS

CN 101261281 A 9/2008
CN 104164138 A 6/2009

(Continued)

OTHER PUBLICATIONS

Said et al. , Carving fiber-top cantilevers with femtosecond laser micromachining, Journal of Micromechanics and Microengineering, Jan. 21, 2008 (Year: 2008).*

(Continued)

*Primary Examiner* — Duy Vu N Deo
*Assistant Examiner* — Andrew Keelan Laobak
(74) *Attorney, Agent, or Firm* — CANTOR COLBURN LLP

(57) ABSTRACT

A method of manufacturing a transducer includes forming a support structure from a transparent material, the support structure configured to support a sensing element and deform in response to an environmental parameter. Forming the support structure includes modifying a first portion of the transparent material by exposing the first portion to laser radiation, and removing the first portion by an etching process. The method also includes disposing the sensing element at a fixed position relative to the support structure, the sensing element configured to generate a signal indicative of deformation of the support structure.

20 Claims, 9 Drawing Sheets

Related U.S. Application Data

(60) Provisional application No. 62/676,140, filed on May 24, 2018.

(51) Int. Cl.

| | |
|---|---|
| *E21B 47/017* | (2012.01) |
| *G01B 11/16* | (2006.01) |
| *G01D 5/353* | (2006.01) |
| *G01P 15/093* | (2006.01) |

(58) Field of Classification Search

CPC .......................... G01D 5/35377; G01P 15/093; G01P 15/0802

See application file for complete search history.

(56) References Cited

U.S. PATENT DOCUMENTS

| | | | | |
|---|---|---|---|---|
| 4,287,582 | A | 9/1981 | Tocquet | |
| 4,385,525 | A | 5/1983 | Phillips et al. | |
| 4,729,240 | A | 3/1988 | Sugihara et al. | |
| 4,845,688 | A | 7/1989 | Butler | |
| 4,916,497 | A | 4/1990 | Gaul et al. | |
| 5,109,701 | A | 5/1992 | Jacobsen et al. | |
| 5,420,688 | A * | 5/1995 | Farah | G01B 9/02056 250/227.27 |
| 5,493,390 | A | 2/1996 | Varasi et al. | |
| 5,633,494 | A | 5/1997 | Danisch | |
| 5,745,611 | A | 4/1998 | Komachiya et al. | |
| 5,889,901 | A | 3/1999 | Anderson et al. | |
| 5,891,747 | A | 4/1999 | Farah | |
| 5,919,607 | A | 7/1999 | Lawandy | |
| 6,016,702 | A | 1/2000 | Maron | |
| 6,160,762 | A | 12/2000 | Luscombe et al. | |
| 6,246,048 | B1 | 6/2001 | Ramos et al. | |
| 6,396,572 | B1 | 5/2002 | Chang et al. | |
| 6,505,516 | B1 | 1/2003 | Frick et al. | |
| 6,523,415 | B2 | 2/2003 | Kurtz et al. | |
| 6,563,968 | B2 | 5/2003 | Davis et al. | |
| 6,861,276 | B2 | 3/2005 | Kurtz | |
| 7,082,079 | B2 | 7/2006 | Woo | |
| 7,345,953 | B2 | 3/2008 | Crickmore et al. | |
| 7,536,917 | B2 | 5/2009 | Baba | |
| 7,743,661 | B2 | 6/2010 | Berthold et al. | |
| 8,174,703 | B2 | 5/2012 | Wang et al. | |
| 8,503,834 | B2 | 8/2013 | Arkwright et al. | |
| 8,687,927 | B2 | 4/2014 | Grosso et al. | |
| 8,752,435 | B2 | 6/2014 | Belleville et al. | |
| 9,018,030 | B2 | 4/2015 | Li et al. | |
| 9,296,066 | B2 | 3/2016 | Hosseini et al. | |
| 9,429,480 | B2 | 8/2016 | Smith et al. | |
| 9,476,294 | B2 | 10/2016 | Harman et al. | |
| 9,589,686 | B2 | 3/2017 | Potyrailo | |
| 9,701,581 | B2 | 7/2017 | Kangastupa et al. | |
| 9,702,755 | B2 | 7/2017 | Akkaya et al. | |
| 9,757,815 | B2 | 9/2017 | Hosseini | |
| 9,995,642 | B2 | 6/2018 | Shimoyama et al. | |
| 10,376,986 | B2 | 8/2019 | Hosseini | |
| 10,438,039 | B2 | 10/2019 | Jin et al. | |
| 10,444,063 | B2 | 10/2019 | Jung et al. | |
| 2002/0009252 | A1 | 1/2002 | Maron et al. | |
| 2002/0071626 | A1 | 6/2002 | Davis et al. | |
| 2003/0066356 | A1 | 4/2003 | Kanellopoulos et al. | |
| 2004/0114849 | A1 | 6/2004 | Shah et al. | |
| 2004/0140732 | A1 | 7/2004 | Truninger et al. | |
| 2004/0237648 | A1 | 12/2004 | Jones et al. | |
| 2007/0157735 | A1 | 7/2007 | Kurtz et al. | |
| 2008/0016683 | A1 | 1/2008 | Brida et al. | |
| 2008/0188776 | A1 | 8/2008 | Arkwright et al. | |
| 2009/0279099 | A1 | 11/2009 | Wang et al. | |
| 2009/0314096 | A1 | 12/2009 | Colombo | |
| 2011/0191031 | A1 | 8/2011 | Harman et al. | |
| 2012/0177319 | A1 | 7/2012 | Alemohammad et al. | |
| 2012/0216621 | A1 | 8/2012 | Oto | |
| 2013/0220972 | A1 | 8/2013 | Gamage | |
| 2013/0306592 | A1 | 11/2013 | Yang et al. | |
| 2015/0253901 | A1 | 9/2015 | Chan | |
| 2015/0330830 | A1 * | 11/2015 | Akkaya | G02B 6/262 385/25 |
| 2015/0370374 | A1 | 12/2015 | Chan | |
| 2016/0202135 | A1 | 7/2016 | Sanzari | |
| 2016/0266265 | A1 | 9/2016 | Kruspe et al. | |
| 2016/0277847 | A1 | 9/2016 | Joet | |
| 2016/0282978 | A1 | 9/2016 | Wang | |
| 2017/0292374 | A1 | 10/2017 | Tackmann et al. | |
| 2018/0087956 | A1 * | 3/2018 | Jung | G01H 9/004 |
| 2018/0209859 | A1 | 7/2018 | Ho et al. | |
| 2018/0326456 | A1 | 11/2018 | Park et al. | |
| 2019/0150785 | A1 | 5/2019 | Zaman et al. | |
| 2019/0243062 | A1 | 8/2019 | Fok et al. | |
| 2019/0360323 | A1 | 11/2019 | Jung et al. | |
| 2020/0319049 | A1 | 10/2020 | Qing et al. | |

FOREIGN PATENT DOCUMENTS

| | | | |
|---|---|---|---|
| CN | 105443117 | A | 3/2016 |
| WO | 2015024608 | A1 | 2/2015 |
| WO | 2017006233 | A1 | 12/2017 |

OTHER PUBLICATIONS

Anonymous; "Comprehensive List of Transparent Polymers"; SpecialChem, available online at "https://omnexus.specialchem.com/tech-library/article/comprehensive-list-of-transparent-polymers"; 14 pages (2017).

Gottmann, et al.; "Digital Photonic Production of Micro Structures in Glass by In-Volume Selective Laser-Induced Etching Using a High Speed Micro Scanner"; Physics Procedia 39 (2012); 8 pages.

Gottmann, et al.; "Microcutting and Hollow 3D Microstructures in Glasses by In-vol. Selective Laser-Induced Etching (ISLE)"; JLMN—Journal of Laser Micro/Nanoengineering vol. 8, No. 1, 2013; 4 pages.

He,et al.; "Femtosecond Laser Fabrication of Monolithically Integrated Microfluidic Sensors in Glass"; Sensors; 2014; Retrieved from the Internet; URL:http://www.ncbi.nlm.nih.gov/pmc/articles/PMC4239949/pdf/sensors-14-19402.pdf. 30pages.

Hermans, et al.; "Selective, Laser-Induced Etching of Fused Silica at High Scan-Speeds Using KOH"; Journal of Laser Micro/Nanoengineering; Jun. 2014; 7 pages.

PCT International Search Report and Written Opinion; PCT Application No. PCT/US2019/033961; Mailed Sep. 18, 2019; 9 pages.

Said et al. Carving fiber-top cantilevers with femtosecond laser micromachining; Journal of Micromechanics and Microengineering; [online], Jan. 21, 2008; p. 1-2.

Stuchebnikov, V. B.; "Silicon-on-Sapphire Structures as a Material for Piezoresistive Mechanical Transducers"; Journal of Communications Technology and Electronics, vol. 50, No. 6, 2005, pp. 622-637; 16 pages.

Sugioka, et al; "Ultrafast Lasers-Reliable Tools for Advanced Materials Processing"; Light: Science & Applications (2014) 3; 12 pages.

* cited by examiner

TRANSDUCERS INCLUDING LASER ETCHED SUBSTRATES

CROSS REFERENCE TO RELATED APPLICATIONS

This application is a Divisional of U.S. Nonprovisional application Ser. No. 16/421,967, filed May 24, 2019, which claims the benefit of an earlier filing date from U.S. Provisional Application Ser. No. 62/676,140, filed May 24, 2018, the entire disclosure of both of which are incorporated herein by reference.

BACKGROUND

In the energy industry, optical fiber sensors are commonly used to facilitate exploration of resource bearing formations and production of resources from such formations. For example, optical fiber sensors can be utilized in a borehole for communications and measurements, e.g., to obtain various surface and downhole measurements, such as pressure, temperature, stress, acceleration, inclination, velocity, displacement, force and strain.

SUMMARY

An embodiment of a method of manufacturing a transducer includes forming a support structure from a transparent material, the support structure configured to support a sensing element and deform in response to an environmental parameter. Forming the support structure includes modifying a first portion of the transparent material by exposing the first portion to laser radiation, and removing the first portion by an etching process. The method also includes disposing the sensing element at a fixed position relative to the support structure, the sensing element configured to generate a signal indicative of deformation of the support structure.

An embodiment of a borehole system includes a borehole string disposed in a borehole, and a transducer disposed with the borehole string. The transducer includes a support structure formed from a transparent material, the support structure configured to support a sensing element and deform in response to an environmental parameter. The support structure is formed by modifying a first portion of the transparent material by exposing the first portion to laser radiation, and removing the first portion by an etching process. The system also includes the sensing element disposed at a fixed position relative to the support structure, the sensing element configured to generate a signal indicative of a deformation of the support structure.

An embodiment of a transducer includes a support structure formed from a transparent material, the support structure configured to support a sensing element and deform in response to an environmental parameter. The support structure is formed by modifying a first portion of the transparent material by exposing the first portion to laser radiation, and removing the first portion by an etching process. The transducer also includes the sensing element disposed at a fixed position relative to the support structure, the sensing element configured to generate a signal indicative of a deformation of the support structure.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Apparatuses, systems and methods are provided for manufacturing a transducer (e.g., a sensor) and utilizing the transducer to perform a measurement of an environmental parameter. An environmental parameter may be any condition, property, force or other phenomenon that is desired to be measured. An embodiment of the transducer includes an optical fiber or fibers operably connected to a transparent support structure. At least the support structure is formed based on a laser modification and removal process, such as an in-volume selective laser induced etching (ISLE) process followed by a wet chemical etching or vapor etching process. The optical fiber may be operable connected in any suitable manner, such as by fixedly attaching the optical fiber to the support structure by a mechanical joining (e.g., an adhesive). In one embodiment, the transducer is part of a highly integrated sensor in which a three-dimensional support structure and a length of an optical fiber are written directly into the transparent material. The process allows for creation of three-dimensional structures with high precision that can improve the functionality of the transducer, e.g., by increasing sensitivity, as compared to other sensors or transducers.

Figure 1:
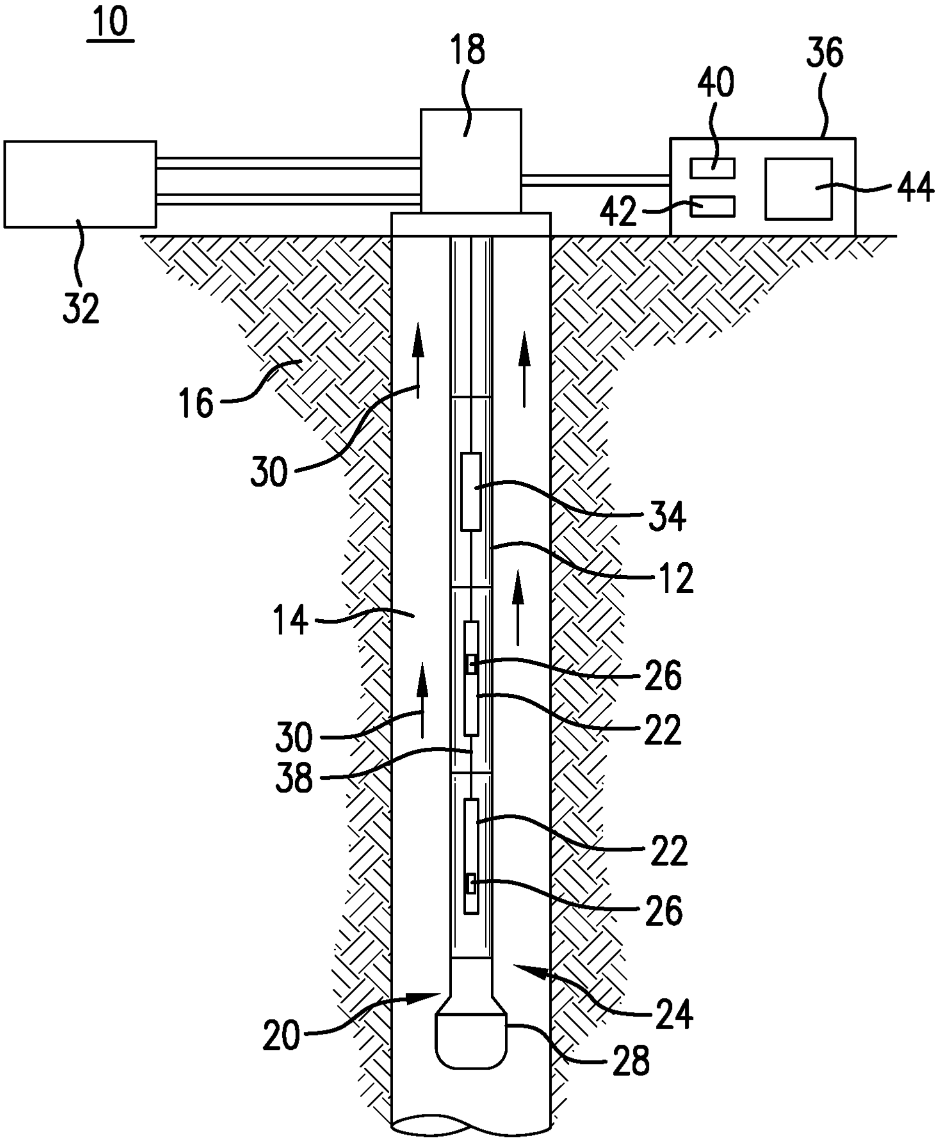
FIG. 1 depicts an embodiment of a resource exploration and/or production system.

FIG. 1 illustrates an embodiment of a resource exploration and/or production system 10 that can include a sensor as described further herein. In this example, the system 10 is a well drilling, logging and/or production system 10 that includes a borehole string 12 configured to be disposed in a borehole 14 that penetrates an earth formation 16 during a drilling or other downhole operation. It is noted that the system 10 is provided for discussion purposes as an embodiment of an application of the sensor. The sensor is not so limited, as it can be used in conjunction with any device or system that includes measurements, whether downhole, subsea at a surface location or any other location.

In the example of FIG. 1, a surface structure 18 includes various components such as a wellhead, derrick and/or rotary table for supporting the borehole string 12 and operating downhole components. In one embodiment, the borehole string 12 is a drillstring including one or more drill pipe sections that extend downward into the borehole 14, and is connected to a drilling assembly 20. In one embodiment, the system 10 includes any number of downhole tools 22 for various processes including formation drilling, geosteering, and formation evaluation (FE) for measuring versus depth and/or time one or more physical quantities in or around a borehole. The tool 22 may be included in or embodied as a bottomhole assembly (BHA) 24, drillstring component or other suitable carrier. A "carrier" as described herein means any device, device component, combination of devices, media and/or member that may be used to convey, house, support or otherwise facilitate the use of another device, device component, combination of devices, media and/or member. Exemplary non-limiting carriers include drill strings of the coiled tubing type, of the jointed pipe type and any combination or portion thereof. Other carrier examples include casing pipes, wirelines, wireline sondes, slickline sondes, drop shots, downhole subs, bottom-hole assemblies, and drill strings.

The system 10 includes at least one sensor configured to measure various environmental parameters. The sensor may be a distributed sensor such as a fiber optic distributed temperature sensor (DTS) and/or a fiber optic distributed acoustic sensor (DAS). The sensor may also be a discrete sensor configured to measure the parameter at a discrete location or region of a subterranean environment. For example, the tool 22 includes a fiber optic sensor 26 that includes a length of an optical fiber attached to or otherwise operably connected to a transparent support structure.

The fiber optic sensor 26 can be used to measure parameters relating to a downhole operation such as a drilling operation. In a drilling operation, a drill bit 28 is rotated and drilling fluid 30 (e.g., drilling mud) is injected through the borehole string 12 from a mud pit 32 or other fluid source, and returns to the surface through an annular section of the borehole 14. The fiber optic sensor 26 can be configured to measure parameters such as strain, vibration, fluid pressure, fluid flow rate and temperature.

One or more downhole components, such as the tool 22 and/or the fiber optic sensor 26, are equipped with transmission equipment to communicate with a processing device such as a downhole processor 34 or a surface processing unit 36. Such transmission equipment may take any desired form, and different transmission media and connections may be used. Examples of connections include wired, fiber optic, acoustic, wireless connections and mud pulse telemetry. In one embodiment, the system 10 includes a communication cable 38 that includes one or more conductors such as electrical conductors and/or optical fibers. The cable 38 may include a first length of an optical fiber that is connected (e.g., by splicing) to a second length of an optical fiber that is part of the fiber optic sensor 26. In one embodiment, a single optical fiber can form the first length and the second length.

The processing device includes components for performing functions including communication, data storage, data processing and/or control of components. For example, the surface processing unit 36 includes a detector 40 (e.g., an optical signal detector), a processor 42 (e.g., a microprocessor) and memory 44 to store data, models and/or computer programs or software. The processing device may be configured to perform functions such as controlling deployment of downhole components, controlling operation of components, transmitting and receiving data, processing measurement data and/or monitoring operations.

The optical fiber sensor 26 includes a length of an optical fiber that includes one or more measurement locations. The length of the optical fiber is disposed on a support structure including a transparent material that is at least partially formed by a laser modification and removal process. The support structure may include a three-dimensional structure made from the transparent material, which supports and/or interacts with the length of the optical fiber As described herein, a "transparent material" is a material that is transparent to at least a wavelength or wavelength range used by a laser to modify a portion of a transparent material by changing its refractive index and or changing its mechanical properties prior to removal of the portion.

The laser modification and removal process, which in one embodiment is an in-volume selective laser induced etching (ISLE) process, laser radiation is applied to modify the internal structure of a portion of a transparent material, and the modified portion is subsequently removed, e.g., by an etching process. Examples of etching processes include chemical or wet chemical etching, plasma etching, and vapor etching, for example. The laser modification and removal process described herein can be distinguished from processes such as laser ablation, which involve evaporating or otherwise removing material by a laser without an initial modification of the material.

In one embodiment, the laser modification and removal process includes modifying a portion of transparent material by a pulsed laser. The pulsed laser may have any suitable power, and in one embodiment has a power in the range of about 100 Watts to about one kW. The power and pulse duration of the laser radiation used for removal may be adjusted or customized based on the type of transparent material used.

In one example, the laser modification and removal process includes the steps of designing a two-dimensional or three-dimensional transparent structure, determining the dimensions of the structure, and identifying portions of a transparent material that should be removed to realize the structure. After dimensions of a desired structure are determined, the material is modified by focusing a pulsed laser to locations in the identified portions. In one embodiment, the pulsed laser has pulse durations on the order of femtoseconds (e.g., 10 fs to 500 fs). The modified volume is then removed by an etching or other removal process.

Due to the initial modification, the etching rate of the modified volume can be significantly increased, e.g., can be increased by up to four orders of magnitude. In addition, the process can achieve extremely narrow widths of cut. For example, portions of a material having a thickness of 5 microns or less can be removed from a material having a thickness of about 1 mm. Using a microscanner, shapes of any configuration can be cut to a precision of 1 micron, with the cut-out part and the resulting shaped hole exhibiting a roughness Rz of, e.g., less than one micron. Since the process allows to produce three-dimensional structures with high complexity, structures can be designed and/or optimized for a selected amplification, sensitivity, resonance frequency, cutoff frequency, or transfer function. For example, the acoustic transducer and/or the fiber optic sensor 26 may have a resonance frequency or cutoff frequency having a selected value or range. Examples of cutoff frequency ranges include a range of about 1 Hz to about 100 kHz, a range of about 1 kHz to about 40 kHz, and/or a range of about 2 kHz to about 16 kHz.

Figure 2:
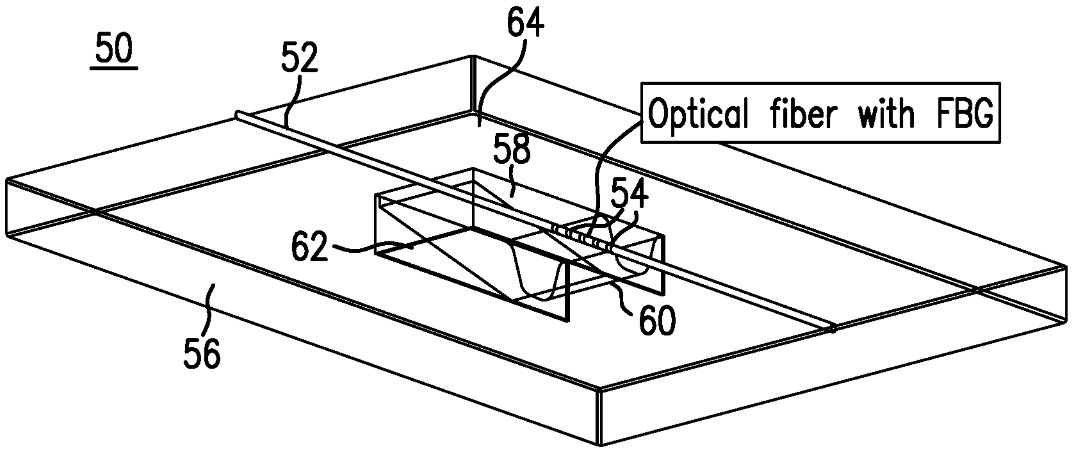
FIG. 2 depicts an embodiment of a transducer that includes a transparent support structure formed by a laser modification and removal process.

FIG. 2 shows an example of a sensor 50 that includes a sensing element and a substrate. The substrate includes a transparent material that has been shaped or formed by a laser modification and removal process as described herein. The sensor 50 acts as a transducer by converting energy from an environmental parameter to a detectable form.

In this example, the sensing element is a length of an optical fiber 52. The length of the optical fiber 52 includes one or more measurement locations disposed therein. The measurement locations may be fiber Bragg gratings (FBGs) 54 or any other suitable mechanisms for backscattering or otherwise returning optical signals. Other examples of measurement locations include reflective surfaces, Fabry-Perot etalons, and locations of intrinsic scattering such as Rayleigh, Brillouin, and Raman scattering locations. The optical fiber 52 can be mechanically joined to the substrate or formed integrally with the support structure by, e.g., forming both the support structure and the optical fiber 52 by the laser modification and removal process.

The sensor 50 includes a transparent substrate 56 that includes a transparent three-dimensional support structure 58 that has been formed from the substrate 56. In this example, the sensor 50 is a fiber optical acoustic transducer, such as a hydrophone. The transducer converts pressure variation into FBG central wavelength shifts. In this example, a flexural element 60 is formed as part of the support structure 58. Portions of the flexural element 60 can have very small thicknesses, e.g., on the order of microns.

In one embodiment, the substrate 56 includes a cavity 62 below the support structure. The sensor 50 may include pressure compensation features including a fluid configured to compensate for pressure differences at various depths or locations in a borehole. Such pressure differences can be very large (e.g., pressures can vary from pressures on the order of 10 bar or less, up to 100 bar and/or up to 1000 bar or more). The fluid may be a high compressibility fluid such as silicone oil.

In one embodiment, the support structure 58 is at least partially surrounded by a frame portion 64 of the substrate 50. One or more gaps may be established between the support structure 58 and the frame portion 64, which can act as pressure compensation features. The one or more gaps may include or be configured as a fluid seal against high velocity fluid flow (such as oscillations due to acoustic waves the sensor 50 is configured to measure). For example, a seal material (e.g., polymer or rubber) may be disposed within the one or more gaps, or the one or more gaps may form a labyrinth seal. A labyrinth seal is a mechanical seal that forms a tortuous fluid path from the cavity 62. It is noted that the support structure 58 and the frame 64 may be made from the same material, from materials have the same or similar CTE, and/or be a unitary body.

The one or more gaps may have very small widths or dimensions. For example, the one or more gaps have sizes small enough to act as a labyrinth seal, such as less than or equal to about 100, less than or equal to about 50 μm, and/or less than or equal to about 10 μm.

The section of the optical fiber 52 including the FBGs 54 is positioned on the support structure 58 so that acoustic signals incident on the support structure 58 cause a change in the optical path length between the FBGs, which can be measured by transmitting optical signals into the optical fiber 52 and detecting backscattered or return signals. Also in this example, the flexural element 60 leverages the lever principle to provide amplification. Furthermore, support structure can include a wedge profile, which reduces the mass of the support structure 58 and thus increases its fundamental frequency. The volume selective laser etching process (ISLE) is ideally suited to manufacture such a support structure with high precision.

The support structure 58 can be made from any suitable material that has transparency to the wavelength used to modify the support structure material. Examples of transparent materials include glass, such as fused silica, borosilicate glass, or sapphire and ruby. For example, fused silica can be selected for both the transparent substrate material and the optical fiber 52, which offers the unsurpassable advantage of an at least substantially perfect coefficient of thermal expansion (CTE) match. As such, the sensor 50 can produce measurements without the need for temperature correction. Some or all of the support structure 58, the frame portion 64 the flexural element 60, the optical fiber 52, the substrate 56 and/or other components may be made from materials with same CTE (or similar CTE such as within 20%, e.g., about a 10% CTE difference or less), may be made from the same material, and/or may be one integral part (unitary body).

The fiber optic sensor 50 may be utilized to measure a parameter of any desired environment, such as a parameter of a downhole environment (e.g., as the sensor 26). The fiber optic sensor 50 is suitable for static and dynamic measurement systems or sensors in downhole applications.

Although the sensing element of FIG. 2 is an optical fiber, it is not so limited. The sensing element can be any type of element or component that can be disposed on, attached to or otherwise be operable connected to the support structure 58. For example, the sensing element may be a piezoelectric element, a piezoresistive element and/or a capacitive measurement element for conversion of physical properties (also referred to as environmental parameters) into electrical or optical signals. An example of piezoresistive elements on transparent substrates is the Silicon on Sapphire (SOS) technology. SOS technology can be used to attach piezoresistors using, diffusion or ion-implantation and can be implemented to realize pressure transducers and other measurement devices. For example, piezoresistive sensor elements may be fabricated from polysilicon and positioned on the surface of transparent substrates made from polysilicon. The sensitivity of these transducers could be further enhanced by implementing mechanical amplification features manufactured with the laser modification and removal process.

Although a single sensing element is shown in FIG. 2, the sensor 50 can have any number of sensing elements or any combination of types of sensing elements disposed on one or more transparent support structures.

Figure 3:
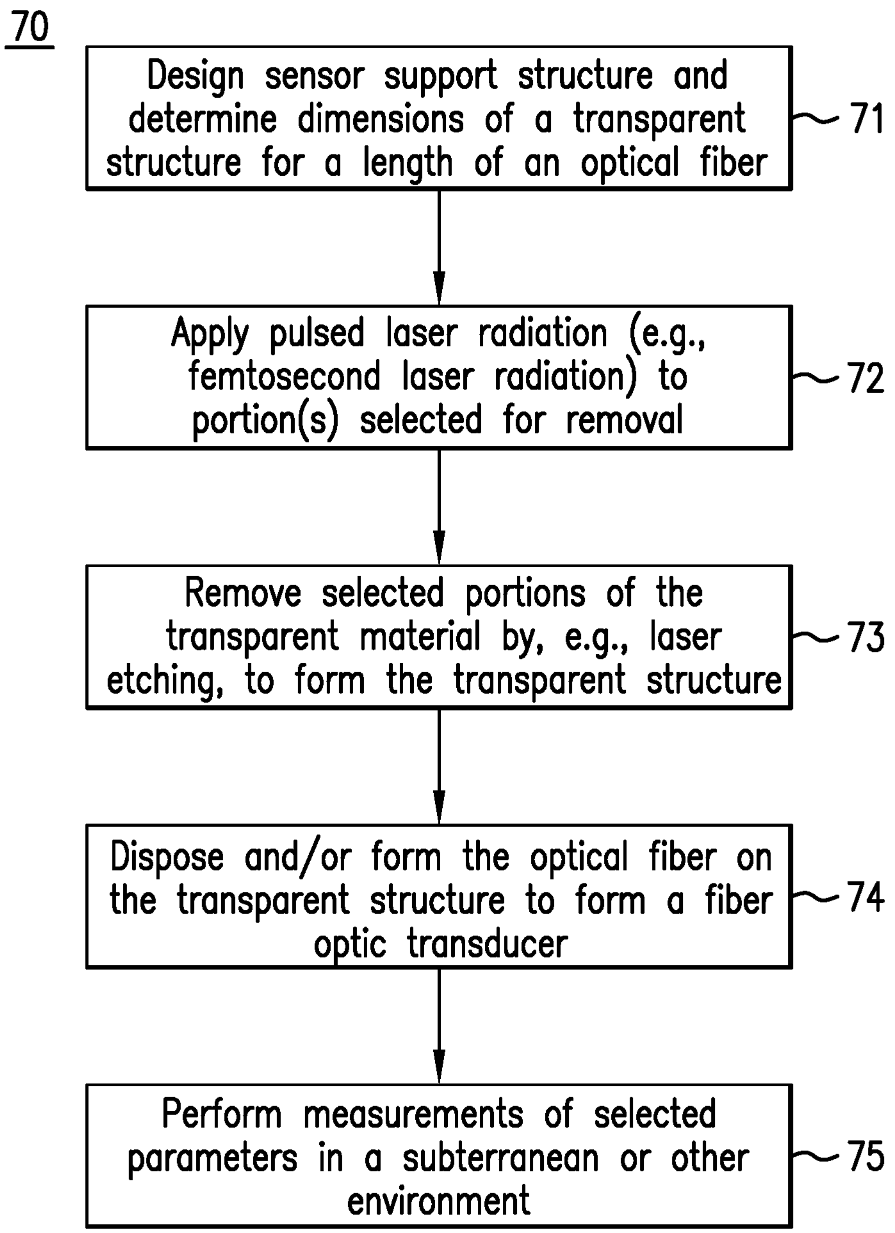
FIG. 3 is a flow diagram depicting an embodiment of a method of manufacturing a sensor or transducer and/or performing measurements of an environmental parameter.

FIG. 3 illustrates a method 70 for manufacturing a transducer or sensor and/or performing measurements of environmental parameters. The method 70 includes one or more of stages 71-75 described herein. In one embodiment, the method includes the execution of all of stages 71-75 in the order described. However, certain stages 71-75 may be omitted, stages may be added, or the order of the stages changed.

In the first stage 71, a support structure for a fiber optic sensor is designed. For example, dimensions of a two- or three-dimensional support structure (e.g., the support structure of FIG. 2) are determined. The support structure is made at least partially from a transparent material, which is transparent to the wavelength(s) used modify the internal structure of portions of the transparent material. The support structure may be made entirely or partially from the transparent material. Thus, all or part of the support structure includes a two-dimensional or three-dimensional transparent structure. Portions or volumes of the transparent material are selected for removal, so that removal of the portions results in the transparent structure.

In the second stage 72, selected portions of the transparent material are exposed to electromagnetic radiation from a pulsed laser to modify the internal structure of the material making up the portions. The wavelength of the radiation is, for example, about 1030 nm, but can be any suitable wavelength. In one embodiment, the radiation is applied in ultrashort pulses, which are typically on the order of picoseconds or less. For example, the laser radiation is applied with a pulse rate on the order of femtoseconds, e.g., having pulse durations of about tens to hundreds of femtoseconds.

The pulsed radiation is focused inside the transparent material and scanned through the volume of the transparent material corresponding to the portion to be removed. For example, the laser may be scanned as a set of stacked two-dimensional slices.

In the third stage 73, the portions of the transparent material that have been modified are removed to form the transparent structure. In one embodiment, the portions are removed by a laser etching process, although any suitable etching or removal process may be used.

In the fourth stage 74, a length of an optical fiber or another sensing element is disposed and/or formed on the transparent structure. In one embodiment, a length of an optical fiber having measurement locations (e.g., FBGs) is positioned on the transparent structure so that changes or deformations in the transparent structure due to an environmental parameters (e.g., temperature, vibration, strain, etc.) cause corresponding changes in the optical fiber length so that backscattered optical signals can be analyzed to measure the parameter. The optical fiber length can be disposed on the transparent structure via an adhesive or other suitable mechanism.

In one embodiment, the length of the optical fiber is formed from the transparent material by the laser modification and removal process along with the transparent structure, thereby forming an integrated transducer having the structure and the optical fiber formed from a single volume of the transparent material. FBGs or other measurement locations can be subsequently formed in the optical fiber, e.g., by inscribing gratings using a pulsed ultraviolet laser.

In the fifth stage 75, the transducer is disposed at a desired location or environment and operated to perform measurements of selected parameters. In one embodiment, the transducer is utilized as a sensor in a system for exploration and/or production of a resource from a resource bearing formation. For example, the transducer can be disposed in a borehole for measurement of one or more physical properties such as pressure, temperature, stress, acceleration, inclination, velocity, displacement, vibration, force, strain and/or other parameter relevant to downhole operations. In another example, the transducer is configured as an acoustic sensor configured to measure vibrations in a borehole and/or earth formation.

FIGS. 4-10 depict various examples of sensors or sensor devices, each of which has a sensing element and a substrate. The substrate includes a transparent material that has been shaped or formed by a laser modification and removal process as described herein. The sensors act as transducers by converting energy from an environmental parameter to a detectable form.

In the following examples, the sensors are acceleration sensors. However, the sensors are not so limited and can be configured to measure various parameters, such as strain, vibration, temperature, pressure and others. It is noted that the shapes, sizes and dimensions of the various components of the sensors in the following examples are not limited to those described herein.

Figure 4:
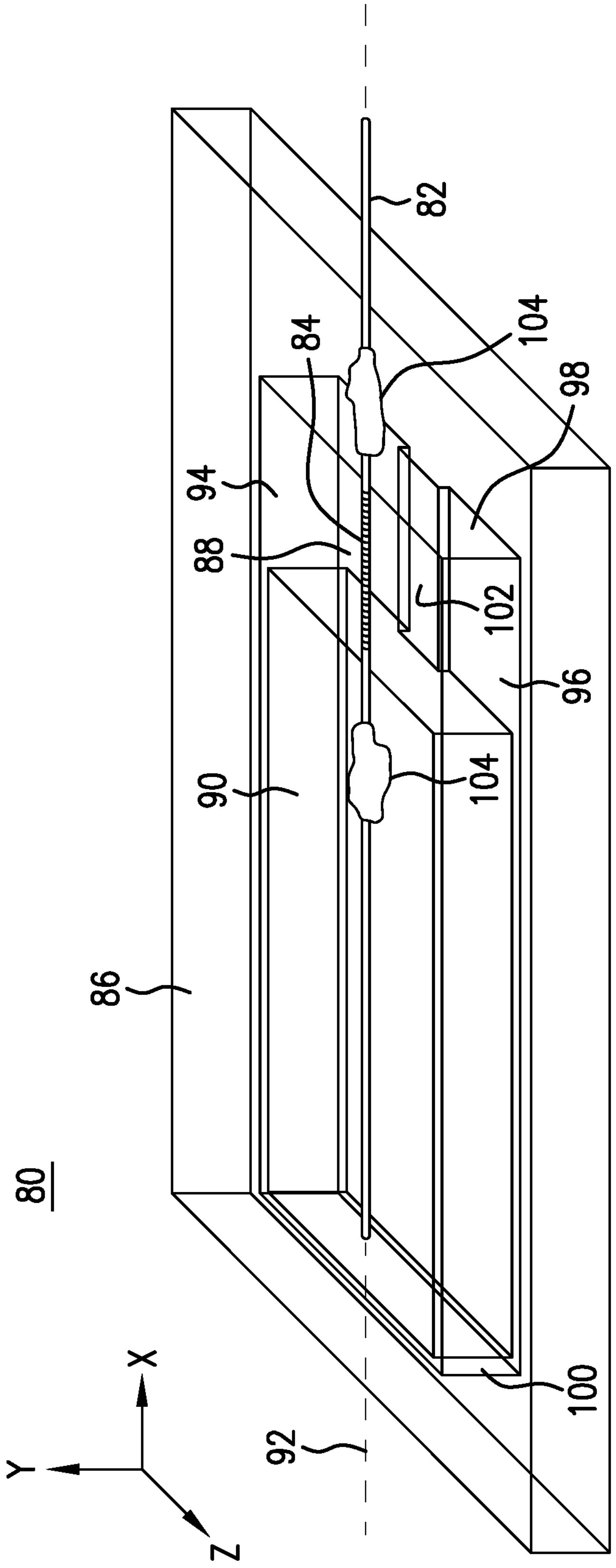
FIG. 4 depicts an example of an acceleration sensor including a transparent support structure formed by a laser modification and removal process such as the method of FIG. 3.

Referring to FIG. 4, an example of a sensor 80 is a fiber optic acceleration sensor that includes an optical fiber 82 having one or more measurement locations configured as fiber Bragg gratings (FBGs) 84 or any other suitable mechanisms for backscattering or otherwise returning optical signals. For example, the measurement locations can be formed as reflective surfaces, Fabry-Perot etalons, and locations of intrinsic scattering such as Rayleigh, Brillouin, and Raman scattering locations. The sensor 80 may be disposed at a downhole component or other component for which acceleration is desired to be measured.

The sensor 80 includes a transparent three-dimensional support structure 86 that has been formed from a fused silica glass substrate. Glass has advantages in that glass is relatively elastic and has a low density. The sensor 80 is not so limited and can be formed from any suitable transparent material.

The support structure 86 forms a cavity 88 in which a moveable mass 90 is disposed. The cavity has opposing sides 94 and 96, a first end 98 and a second end 100, and is configured to constrain the mass 90 to move in a direction along a movement axis 92. The sensor 80 is shown in a coordinate space defined by orthogonal x-, y- and z-axes, and the movement axis 92 is shown as parallel to the x-axis. The sensor 80 is not so limited, as the sensor 80 can be configured to permit movement in any suitable direction or directions.

The support structure 86 also forms a flexural element 102 that extends axially from the first end 98 to a location at or near the mass 90. Acceleration of the downhole component in a first direction (a direction along the axis 92 away from the second end 100 and toward the first end 98) causes the mass 90 to apply an axial force to the flexural element 102, which compresses the flexural element 102. Acceleration in a second direction (a direction along the axis 92 toward the second end 100 and away from the first end 98) causes the mass 90 to stretch the flexural element 102. Oscillating axial movement thus causes the flexural element 102 to alternatingly compress and decompress.

The optical fiber 82 is attached to the support structure 86 so that acceleration of the downhole component and associated compression and/or decompression of the flexural element 102 strains the FBGs 84 by compressing and/or stretching the FBGs 84. For example, the optical fiber 82 is attached to the movable mass 90 and the support structure 86 by an adhesive 104 or any other suitable attachment mechanism, so that the FBGs 84 are suspended over the flexural element 102. Some or all of the optical fiber 82, the support structure 86, the moveable mass 90, the flexural element 102 and/or other components may be made from materials with same CTE (or similar CTE such as within 20%, e.g. about a 10% CTE difference or less), may be made from the same material, and/or may be one integral part (unitary body).

Operation of the sensor 80 includes transmitting electromagnetic radiation as light having a selected wavelength (or wavelengths) into the optical fiber 82 (e.g., by a laser), which is partially reflected by the FBGs 84. The wavelength of reflected light is measured to detect a wavelength shift based on deformation of the flexural element 102. The wavelength shift gives a measure of the acceleration that the sensor 80 experiences.

Figure 5:
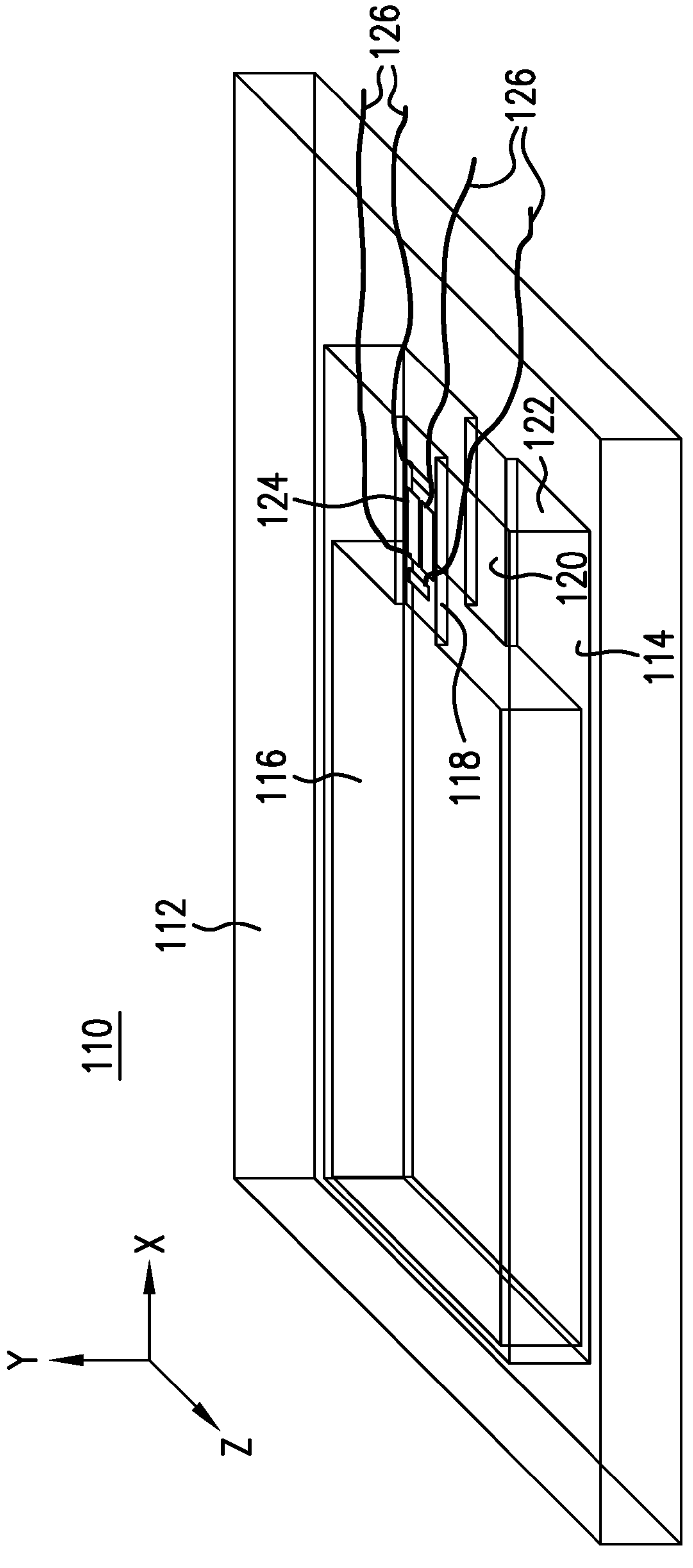
FIG. 5 depicts an example of an acceleration sensor including a transparent support structure formed by a laser modification and removal process such as the method of FIG. 3.
Figure 6A:
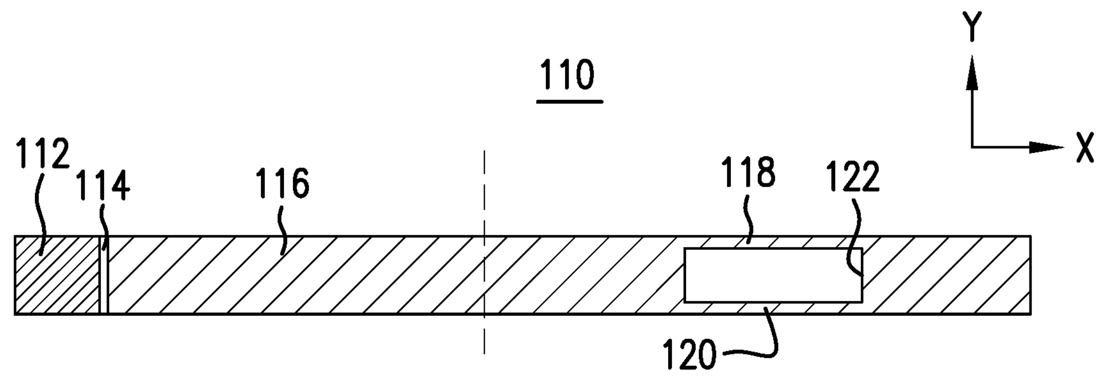
FIGS. 6A and 6B (collectively referred to as FIG. 6) are cross-sectional views of the support structure of FIG. 5 in a neutral state and in a deflected state.
Figure 6B:
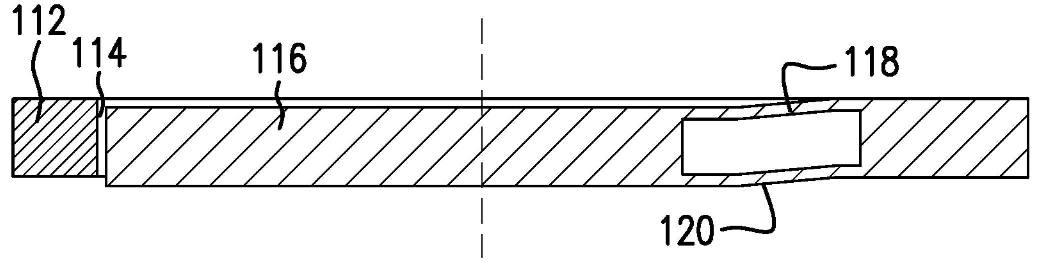
Figure 7:
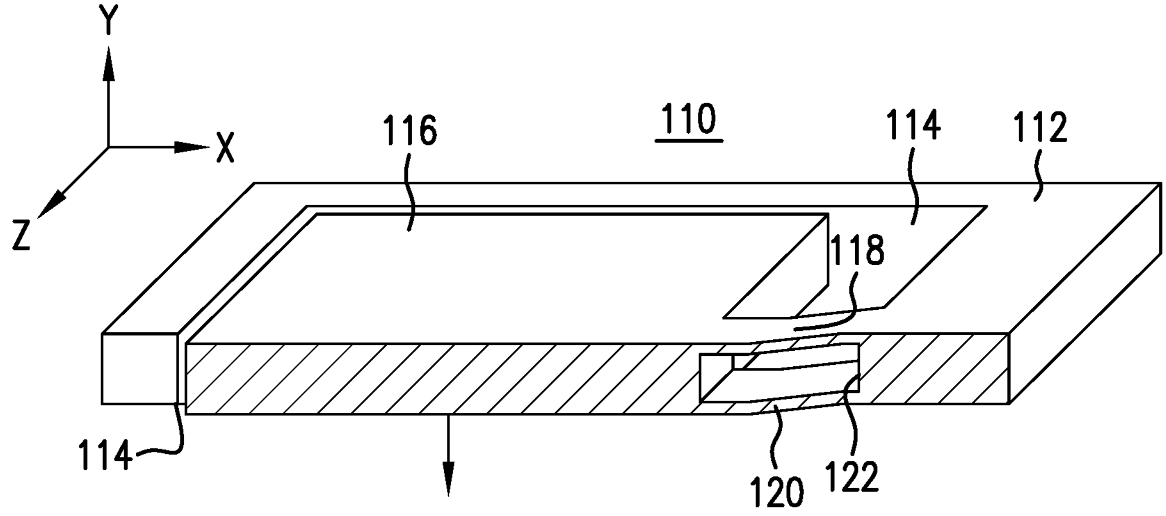
FIG. 7 is a perspective view of the support structure of FIG. 5 in a deflected state.

FIGS. 5-7 depict examples of a sensor 110 that includes a sensing element and a substrate. The substrate includes a transparent material that has been shaped or formed by a laser modification and removal process as described herein.

The sensor 110 includes a transparent three-dimensional support structure 112 that has been formed from a fused silica substrate or other transparent material. The support structure 112 forms a cavity 114 in which a moveable mass 116 is disposed. The cavity 114 is configured to house the mass 116 and allow the mass 116 to move in one or more directions. The support structure 112 and/or the moveable mass 116 may be configured to deform and/or move in multiple directions. For example, the moveable mass 116 can move or deform in various directions defined by the x-axis, the y-axis and/or the z-axis.

The support structure 112 also forms flexural elements, such as an upper flexural element 118 and a lower flexural element 120, each of which extends from an end 122 of the cavity 114 to a location at or near the mass 116.

In this example, the sensor 110 includes a Wheatstone bridge circuit 124, which includes multiple strain gauge elements disposed on the upper flexural element 120. Strain gauge elements can be glued, sputtered, galvanically deposited or otherwise attached to the upper flexural element 118. Each strain gauge element is electrically connected to a processing device, such as a control circuit, via suitable electrical leads 126.

In one embodiment, the moveable mass 116 is moveable in upward and downward directions, i.e., directions parallel to or at least partially parallel to the z-axis. FIGS. 6 and 7 show an example of the support structure 112, which is a unitary body that is made from a single material (e.g., fused silica) and forms the support structure 112, the mass 116 and the flexural elements 118 and 120. Some or all of the support structure 112, the moveable mass 116, the upper flexural element 118, the lower flexural element 120, the cavity 114 and/or other components may be made from materials with same CTE (or similar CTE such as within 20%, e.g. about a 10% CTE difference or less), may be made from the same material, and/or may be one integral part (unitary body).

FIG. 6A shows the sensor 110 in a neutral state, in which the mass 116 is in a neutral (zero deflection) position when the sensor 110 is not subject to an acceleration. FIG. 6B shows the sensor 110 in a deflected state, in which the mass 116 is deflected due to acceleration.

Movement of the mass 116 in the y-axis direction causes the flexural elements 118 and 120 to deform. This deformation is transmitted to the Wheatstone bridge circuit 124, which produces a signal that is affected by deformation of the flexural elements 118 and 120 and is indicative of acceleration of the sensor 110 and the corresponding downhole component.

Figure 8:
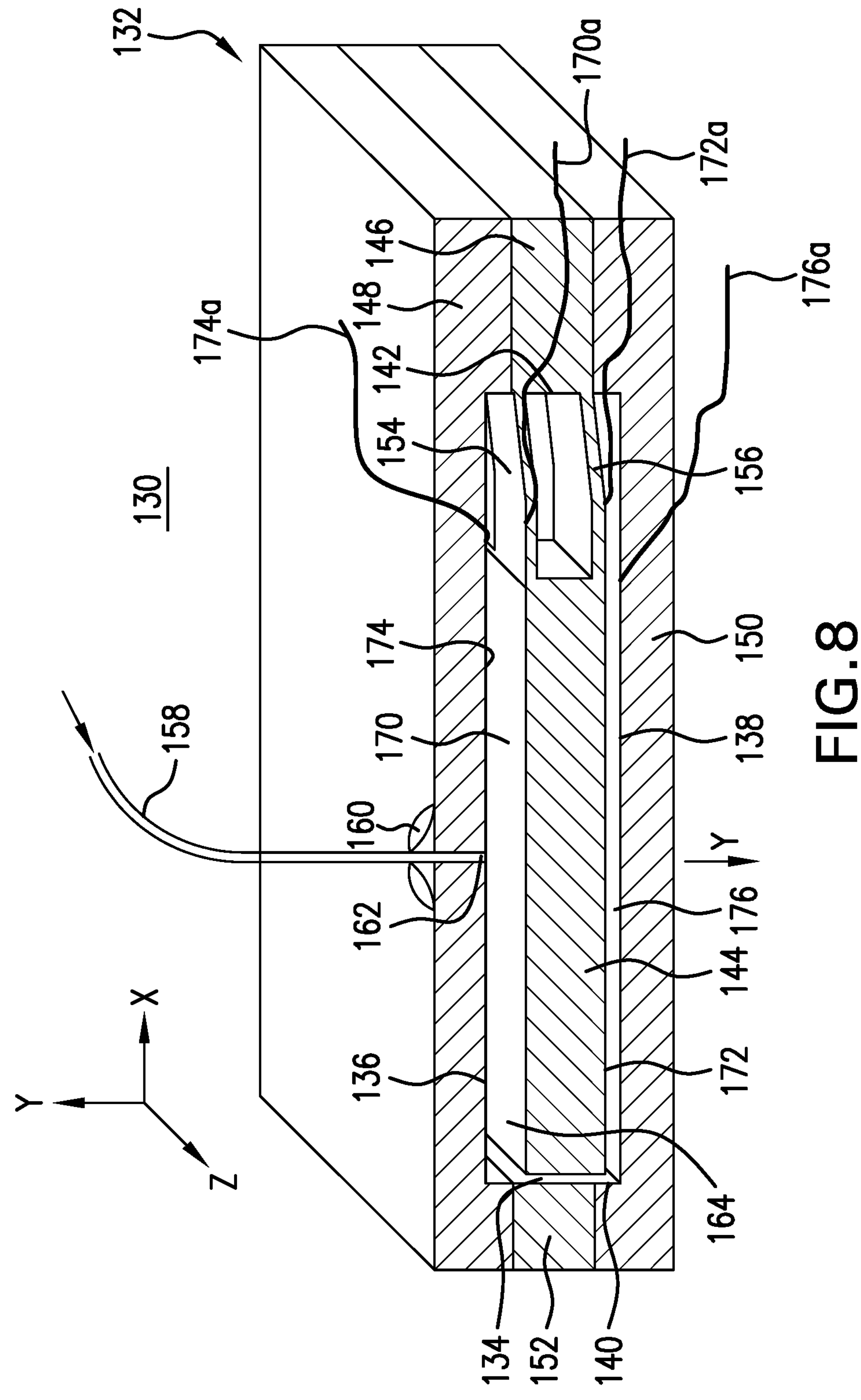
FIG. 8 depicts an example of an acceleration sensor including a transparent support structure having components formed by a laser modification and removal process such as the method of FIG. 3.
Figure 9:
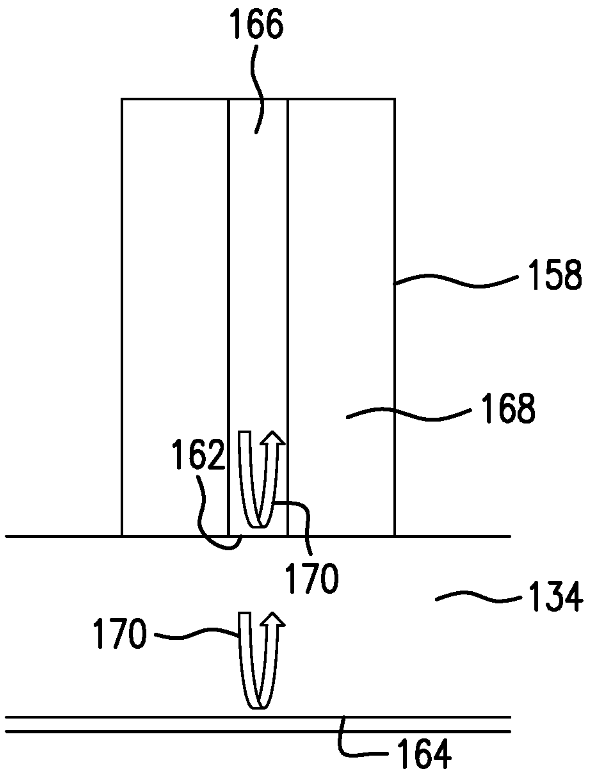
FIG. 9 depicts aspects of a Fabry-Perot interferometer formed by the sensor of FIG. 8.
Figure 10:
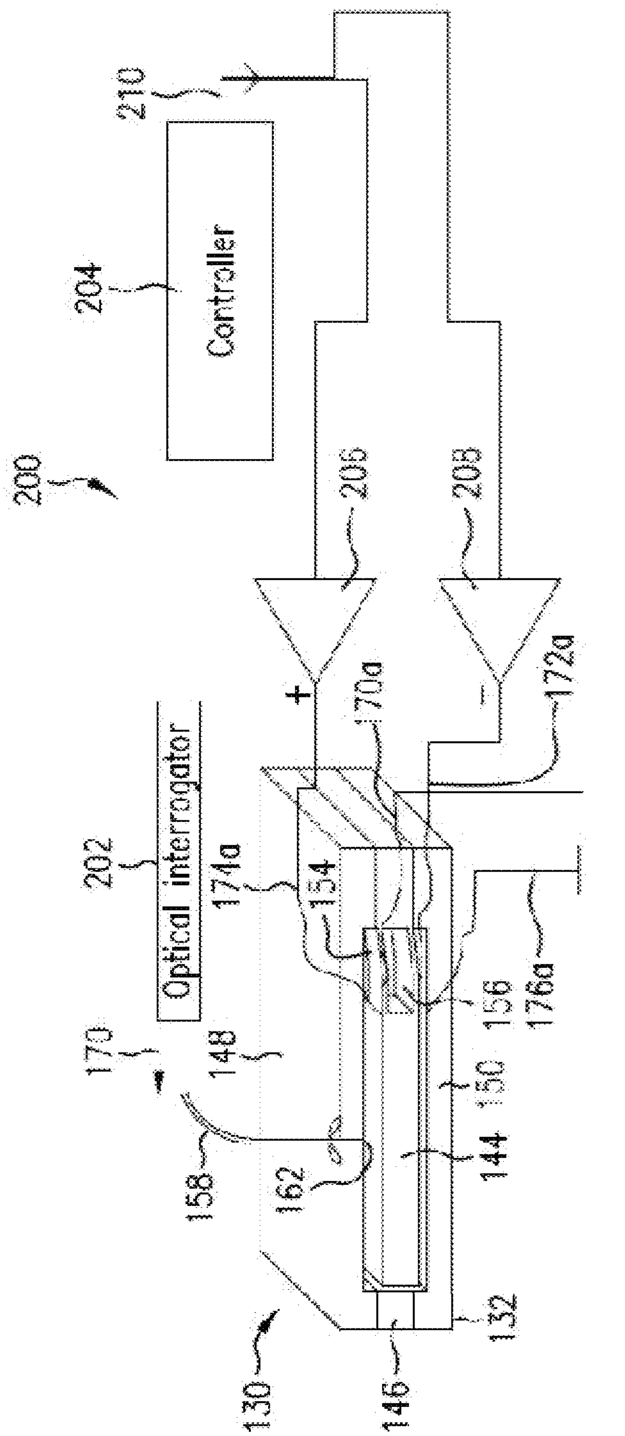
FIG. 10 depicts an example of a control circuit for measuring acceleration and controlling the position of a moveable mass of the sensor of FIG. 8.

FIGS. 8-10 depict an example of a sensor 130 that includes a fiber optic sensing element in combination with a substrate having a transparent material that has been shaped or formed by a laser modification and removal process as described herein. In this example, the sensor 130 includes a transparent three-dimensional support structure 132 that forms a cavity 134. The cavity 134 is bounded by upper and lower surfaces 136 and 138 and cavity ends 140 and 142.

The support structure 132 can be made from multiple components to form the cavity 134 and a moveable mass 144. For example, the support structure 132 includes a central component 146 sandwiched between an upper component 148 and a lower component 150. Some or all of the central component 146, the upper component 148, and the lower component 150 may be made from the same material (e.g., fused silica) materials with same CTE (or similar CTE such as within 20%, e.g. about a 10% CTE difference or less), and/or may be one integral part (unitary body).

The upper component 148 forms a recess that defines the upper surface 136 and part of the cavity ends 140 and 142. The lower component 150 also has a recess that defines the lower surface 138 and part of the cavity ends 140 and 142.

The central component 146 forms a frame 152, the mass 144, and flexural elements 154 and 156 that connect the moveable mass 144 to the frame 152. The central component 146 has dimensions such that the mass 144 can move under acceleration at least in a direction along the y-axis.

An optical fiber 158 extends through a hole in the upper component 148. The optical fiber 158 is secured to the upper component 148 (e.g., via an adhesive 160) so that an end face 162 of the optical fiber 158 is located at a selected distance from a reflective surface 164 of the moveable mass 144. Some or all of the optical fiber 158, the coating 170, the coating 172, the coating 174, the coating 176, the frame 152, the flexural element 154, the flexural element 156, the central component 146, the upper component 148, the lower component 150, the moveable mass 144, the reflective surface 164, the surface 136, the surface 138 and/or other components may be made from materials with same CTE (or similar CTE such as within 20%, e.g. about a 10% CTE difference or less), may be made from the same material, and/or may be one integral part (unitary body).

As shown in FIG. 9, end face 162 of the optical fiber 158 forms a Fabry-Perot interferometer with the reflective surface 164. The optical fiber 158 has a core 166 and a cladding 168, and is configured to direct coherent light 170 to the surface 164. Sending coherent light 170 into the optical fiber 158 results in interference between the light that gets reflected from the surface 164 and light that reflects from the end face 162 of the fiber tip. These interferences can be used to measure the distance between the end face 162 and the reflective surface 164, and thereby measure deflection of the mass 144, which can be used to estimate acceleration.

The sensor 130 may include features to facilitate control of the position of the mass 144 and to allow the sensor 130 to return or maintain the mass 144 in a neutral position (i.e., a position of zero deflection).

Referring again to FIG. 8, for example, a conductive metallic upper coating 170 is disposed on an upper surface of the mass 144, which acts as part of a capacitor as discussed below and may also form the reflective surface 164. A lower conductive coating 172 is disposed on an opposing surface of the mass 144. Conductive coatings 174 and 176 are also disposed on the upper cavity surface 136 and the lower cavity surface 138, respectively.

The conductive coatings can be disposed on their respective surfaces in any suitable manner. For example, one or more metallic coatings can be disposed by vacuum deposition, galvanic processes or any other suitable means.

The conductive coatings 170, 172, 174 and 176 form two electrical capacitors, and are electrically connected to a voltage source by wires 170*a*, 172*a*, 174*a* and 176*a*, respectively. A voltage applied to conductive coatings 170 and 174 will form an electric field, which causes a force to be applied to the mass 144. An additional voltage applied to conductive coatings 172 and 176 generates an electric field that causes an additional force to be applied to the mass 144. These forces created by the electrical fields can be directed to balance the force acting on the mass 144 by the acceleration.

A control circuit, an example of which is discussed below, can be used to operate the sensor 130 in a linear range around zero deflection.

FIG. 10 shows an example of a control circuit 200 that can be connected to the sensor 130. The control circuit 200 includes an optical interrogator 202 that measures optically the deflection of the mass 144 using the Fabry-Perot interferometer. The control circuit 200 also includes a controller 204 that uses an electrical feedback loop to operate the sensor 130 in a linear range around zero deflection.

The controller 204 receives signals from the optical interrogator and controls the sensor using electrical amplifiers 206 and 208. For example, the controller 204 outputs a signal 210 representing acceleration acting on the sensor 130 to the amplifiers 206 and 208, one of which inverts the signal 210. By controlling voltage on the wires 174*a* and 172*a*, the force caused by the electrical field can be regulated to counteract the force caused by acceleration acting on the mass 144.

The feedback loop, as noted above, allows the sensor 140 to be controlled so that the sensor 140 is operated on a selected linear range around zero deflection. In addition, since the electrical feedback loop cannot interfere with the optical measurement of deflection, the sensor 140 shows no inaccuracy caused by interference.

The control circuit and the sensor are not limited to the above examples, and can be configured in other ways. For example, the electrical feedback loop can also be designed using magnetic forces caused by inductances deposited on surfaces of the cavity 134 and the mass 144, in combination with the deposition of magnetic material.

Embodiments described herein present a number of advantages. The selective laser removal method allows for the creation of precise features in a support structure and/or sensing element, thereby increasing the precision and effectiveness of acoustic and other sensors. In addition, the laser removal method can be used to manufacture sensors with less cost, using less material and in less time than other methods.

For example, sensors may be manufactured according to the above embodiments using a single material (e.g., fused silica). Manufacturing a support structure and/or a moveable mass using one material avoids potential problems associated with sensors made from multiple materials (e.g., measurement errors and compromised accuracy) due to differing rates of thermal expansion of different materials. Building a sensor from one material is cheaper and also helps to increase durability, reliability and stability as compared with conventionally made sensors.

In some sensors, there may be very small gaps between, e.g., a moveable mass and support structure. Examples of such gaps include gaps between the support structure 58 and the frame component 62 of FIG. 2, gaps between the moveable mass 90 and the second end 100 of the cavity 88 shown in FIG. 4, and gaps between the moveable mass 144 and the cavity end 140 shown in FIG. 8. Such gaps can be in the range of 50 μm. Such gaps may have small sizes, such as less than or equal to about 100, less than or equal to about 50 μm, and/or less than or equal to about 10 μm. In addition, such gaps can be configured as labyrinth seals as discussed above. The manufacturing methods described herein allow for the efficient creation of such gaps, which can be difficult to build when produced with other manufacturing methods.

Set forth below are some embodiments of the foregoing disclosure:

Embodiment 1: A method of manufacturing a transducer, comprising: forming a support structure from a transparent material, the support structure configured to support a sensing element and deform in response to an environmental parameter, wherein forming the support structure includes modifying a first portion of the transparent material by exposing the first portion to laser radiation, and removing the first portion by an etching process; and disposing the sensing element at a fixed position relative to the support structure, the sensing element configured to generate a signal indicative of deformation of the support structure.

Embodiment 2: The method as in any prior embodiment, wherein the laser radiation includes light with at least one wavelength and the transparent material is transparent to the light with the at least one wavelength of the laser radiation.

Embodiment 3: The method as in any prior embodiment, wherein the laser radiation is emitted as a series of femtosecond pulses.

Embodiment 4: The method as in any prior embodiment, wherein removing the first portion is performed by wet chemical etching, plasma etching, or vapor etching.

Embodiment 5: The method as in any prior embodiment, wherein the sensing element and the support structure are formed from a single volume of the transparent material.

Embodiment 6: The method as in any prior embodiment, wherein disposing the sensing element includes modifying a refractive index of a second portion of the transparent material using a laser.

Embodiment 7: The method as in any prior embodiment, wherein the support structure includes a flexural element configured to amplify the environmental parameter.

Embodiment 8: The method as in any prior embodiment, wherein the sensing element includes an optical fiber having one or more sensing locations disposed therein, the optical fiber configured to receive an optical signal and return a backscattered signal indicative of the deformation of the support structure.

Embodiment 9: The method as in any prior embodiment, wherein the support structure includes a flexural element configured to deform in response to acoustic energy, and transfer at least part of the acoustic energy to the sensing element.

Embodiment 10: The method as in any prior embodiment, wherein the support structure includes a flexural element configured to deform in response to one or more physical properties, the one or more physical properties including at least one of a pressure, a temperature, a stress, an acceleration, an inclination, a velocity, a displacement, a vibration, a force and a strain, the flexural element configured to transfer at least part of the one or more physical properties to the sensing element.

Embodiment 11: A borehole system comprising: a borehole string disposed in a borehole; a transducer disposed with the borehole string, the transducer comprising: a support structure formed from a transparent material, the support structure configured to support a sensing element and deform in response to an environmental parameter, the support structure formed by modifying a first portion of the transparent material by exposing the first portion to laser radiation, and removing the first portion by an etching process; and the sensing element disposed at a fixed position relative to the support structure, the sensing element configured to generate a signal indicative of a deformation of the support structure.

Embodiment 12: A transducer comprising: a support structure formed from a transparent material, the support structure configured to support a sensing element and deform in response to an environmental parameter, the support structure formed by modifying a first portion of the transparent material by exposing the first portion to laser radiation, and removing the first portion by an etching process; and the sensing element disposed at a fixed position relative to the support structure, the sensing element configured to generate a signal indicative of a deformation of the support structure.

Embodiment 13: The transducer as in any prior embodiment, wherein the laser radiation includes light with at least one wavelength and the transparent material is transparent to the light with the at least one wavelength of the laser radiation.

Embodiment 14: The transducer as in any prior embodiment, wherein the laser radiation is emitted as a series of femtosecond pulses.

Embodiment 15: The transducer as in any prior embodiment, wherein the first portion is removed by wet chemical etching, plasma etching, or vapor etching.

Embodiment 16: The transducer as in any prior embodiment, wherein the sensing element and the support structure are formed from a single volume of the transparent material.

Embodiment 17: The transducer as in any prior embodiment, wherein the sensing element is disposed on the support structure by modifying a second portion of the transparent material using a laser, and etching the second portion to form the sensing element.

Embodiment 18: The transducer as in any prior embodiment, wherein the support structure includes a flexural element configured to amplify the environmental parameter.

Embodiment 19: The transducer as in any prior embodiment, wherein the sensing element includes an optical fiber having one or more sensing locations disposed therein, the optical fiber configured to receive an optical signal and return a backscattered signal indicative of the deformation of the support structure.

Embodiment 20: The transducer as in any prior embodiment, wherein the support structure includes a flexural element configured to deform in response to acoustic energy, and transfer the acoustic energy to the sensing element.

Embodiment 21: The transducer as in any prior embodiment, wherein the transducer is configured to be disposed in a resource bearing formation.

The use of the terms “a” and “an” and “the” and similar referents in the context of describing the invention (especially in the context of the following claims) are to be construed to cover both the singular and the plural, unless otherwise indicated herein or clearly contradicted by context. Further, it should further be noted that the terms “first,” “second,” and the like herein do not denote any order, quantity, or importance, but rather are used to distinguish one element from another. The modifier “about” used in connection with a quantity is inclusive of the stated value and has the meaning dictated by the context (e.g., it includes the degree of error associated with measurement of the particular quantity).

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

The invention claimed is:

1. A method of manufacturing a transducer, comprising:

forming a support structure from a transparent material, the support structure configured to support a sensing element and deform in response to an environmental parameter, wherein forming the support structure includes modifying a first portion of the transparent material by exposing the first portion to laser radiation, and removing the first portion by an etching process, the support structure including:

a cavity bounded by a first cavity surface, a second cavity surface opposing the first cavity surface, a first cavity end and a second cavity end;

a flexural element extending into the cavity from the first cavity end or the second cavity end; and a moveable mass supported within the cavity by the flexural element, wherein the moveable mass is moveable at least in a direction that extends from the first cavity surface to the second cavity surface; and disposing the sensing element at a fixed position relative to the support structure, the sensing element configured to generate a signal indicative of movement of the moveable mass within the cavity in response to the environmental parameter.

2. The method of claim 1, wherein the laser radiation includes light with at least one wavelength and the transparent material is transparent to the light with the at least one wavelength of the laser radiation.

3. The method of claim 1, wherein the laser radiation is emitted as a series of femtosecond pulses, each femtosecond pulse having a pulse duration of about tens to hundreds of femtoseconds.

4. The method of claim 1, wherein removing the first portion is performed by wet chemical etching, plasma etching, or vapor etching.

5. The method of claim 1, wherein at least the first cavity end, the second cavity end, the flexural element and the moveable mass are formed from a single volume of the transparent material.

6. The method of claim 5, wherein disposing the sensing element includes modifying a refractive index of a second portion of the transparent material using a laser.

7. The method of claim 1, wherein the flexural element is configured to amplify the environmental parameter.

8. The method of claim 7, wherein the flexural element is made of the transparent material.

9. The method of claim 1, wherein the sensing element includes an optical fiber having one or more sensing locations disposed therein, the optical fiber configured to receive an optical signal and return a backscattered signal indicative of the deformation of the support structure, and disposing the sensing element includes inserting the optical fiber through a first component defining the first cavity surface or a second component defining the second cavity surface, such that an end face of the optical fiber is exposed to the cavity and is configured to direct light toward a surface of the moveable mass.

10. The method of claim 9, further comprising forming a reflective surface on the moveable mass, the reflective surface configured to reflect the light from the first cavity surface or the second cavity surface toward the end face.

11. The method of claim 1, wherein the flexural element is configured to deform in response to acoustic energy, and transfer at least part of the acoustic energy to the sensing element.

12. The method of claim 1, wherein the flexural element is configured to deform in response to one or more physical properties, the one or more physical properties including at least one of a pressure, a temperature, a stress, an acceleration, an inclination, a velocity, a displacement, a vibration, a force and a strain, the flexural element configured to transfer at least part of the one or more physical properties to the sensing element.

13. The method of claim 1, wherein the support structure is integral with a frame portion made from the transparent material, and a gap between the support structure and the frame portion is defined by forming the support structure.

14. The method of claim 13, wherein the gap is configured to receive a fluid and act as a pressure compensation, the gap having a gap size of less than or equal to 100 μm.

15. The method of claim 1, further comprising disposing a first electrically conductive coating on the first cavity surface, disposing a second electrically conductive coating on a first mass surface of the moveable mass facing the first cavity surface, disposing a third electrically conductive coating on the second cavity surface, and disposing a fourth electrically conductive coating on a second mass surface of the moveable mass facing the second cavity surface, the first electrically conductive coating, the second electrically conductive coating, the third electrically conductive coating and the fourth electrically conductive coating configured to be connected to a voltage source and form two electrical capacitors.

16. The method of claim 15, further comprising connecting the sensing element to a controller configured to control the voltage source and use an electrical feedback loop to control a deflection range.

17. The method of claim 1, wherein the transparent material includes at least one of glass, fused silica, borosilicate glass, sapphire, and ruby.

18. The method of claim 1, wherein the sensing element includes a non-optical sensing element configured to deform in response to the environmental parameter.

19. The method of claim 1, wherein the transducer is configured to be disposed in a resource bearing formation.

20. The method of claim 1, wherein the transparent material is transparent to laser light pulses with durations on the order of femtoseconds.

* * * * *